(12) United States Patent
Haifang et al.

(10) Patent No.: US 10,855,019 B2
(45) Date of Patent: Dec. 1, 2020

(54) BEZEL ASSEMBLY AND ELECTRICAL CONNECTION APPARATUS

(71) Applicant: Dell Products L.P., Round Rock, TX (US)

(72) Inventors: Zhai Haifang, Shanghai (CN); Wu Xiaoping, Shanghai (CN); Dong Wei, Shanghai (CN); Zhou Yujie, Shanghai (CN)

(73) Assignee: Dell Products L.P., Round Rock, TX (US)

( * ) Notice: Subject to any disclaimer, the term of this patent is extended or adjusted under 35 U.S.C. 154(b) by 0 days.

(21) Appl. No.: 16/258,106

(22) Filed: Jan. 25, 2019

(65) Prior Publication Data

US 2020/0136297 A1    Apr. 30, 2020

(30) Foreign Application Priority Data

Oct. 25, 2018   (CN) .......................... 2018 1 1251816

(51) Int. Cl.
*H01R 13/447* (2006.01)
*H01R 27/02* (2006.01)

(52) U.S. Cl.
CPC ........... *H01R 13/447* (2013.01); *H01R 27/02* (2013.01)

(58) Field of Classification Search
CPC .... H01R 13/447; H01R 27/02; H01R 13/453; H01R 13/4534; H01R 13/4538; H01R 13/44; H01R 13/74; H01R 13/743; H01R 13/745; H01R 13/6596; H05K 9/0018
USPC ....... 439/136, 135, 137, 138, 142, 144, 147, 439/131, 544, 552, 553
See application file for complete search history.

(56) References Cited

U.S. PATENT DOCUMENTS

| | | | | |
|---|---|---|---|---|
| 4,774,384 A | * | 9/1988 | Gregory ............... | H01R 13/447 174/67 |
| 6,951,469 B1 | * | 10/2005 | Lin ..................... | H01R 13/4534 439/135 |
| 6,955,546 B1 | * | 10/2005 | Huang ............... | H01R 13/5213 439/135 |
| 7,651,346 B2 | * | 1/2010 | Francis ................ | H01R 13/447 174/67 |
| 2014/0308830 A1 | * | 10/2014 | Tseng ................. | H01R 13/5213 439/131 |

* cited by examiner

*Primary Examiner* — Travis S Chambers
(74) *Attorney, Agent, or Firm* — Haynes and Boone, LLP

(57) ABSTRACT

A bezel assembly includes a bezel body having an opening formed thereon for receiving at least a part of a connecting piece. At least one opening shield is movably disposed on the bezel body and pressing against the connecting piece via an elastic element such that the connecting piece remains contact with the bezel assembly in the opening. The bezel assembly of the present disclosure can be adapted to connecting pieces of various types and standards, such as connectors or ports, so as to improve universality of the bezel assembly and expand the application range.

16 Claims, 8 Drawing Sheets

BEZEL ASSEMBLY AND ELECTRICAL CONNECTION APPARATUS

CROSS-REFERENCE TO RELATED APPLICATIONS

This application claims priority to Chinese Application Serial No. 201811251816.6, filed Oct. 25, 2018, entitled "BEZEL ASSEMBLY AND ELECTRICAL CONNECTION APPARATUS,", the disclosure of which is incorporated herein by reference in its entirety.

FIELD

Embodiments of the present disclosure generally relate to the field of electrical devices, and more specifically, to a bezel assembly and an electrical connection apparatus including the bezel assembly.

BACKGROUND

The current electrical devices, such as large-scale data storage platforms, contain a large amount of various types of connectors or ports for data input/output. The common connectors or ports comprise RJ45, SFP+, QSFP, MINISAS HD ports, and so on. The connectors or ports of different types and standards vary in dimensions. In order to adapt to these connectors or ports, it is usually required to design and provide a bezel including openings of different specifications and dimensions.

SUMMARY

In general, embodiments of the present disclosure provide a bezel assembly and an electrical connection apparatus including the bezel assembly.

According to one aspect of the present disclosure, there is provided a bezel assembly. The bezel assembly comprises: a bezel body having an opening formed thereon for receiving at least a part of a connecting piece; at least one opening shield movably disposed on the bezel body and pressing against the connecting piece via an elastic element, such that the connecting piece remains in contact with the bezel assembly in the opening.

In some embodiments, the elastic element is disposed between the bezel body and the opening shield, or between opening shields.

In some embodiments, the at least one opening shield comprises a first opening shield extending along a first direction in parallel with an edge of the bezel body and connected to the bezel body via the elastic element, wherein the first opening shield is adapted to move, in response to an elastic force of the elastic element, along a second direction perpendicular to the first direction within a plane in parallel with the bezel body and to press against the connecting piece.

In some embodiments, the first opening shield is connected to the bezel body by two elastic elements spaced apart in the first direction.

In some embodiments, at least one end of the first opening shield is provided with an extension arm oriented towards the bezel body, wherein the bezel body is provided with a hole at a position corresponding to the extension arm and the extension arm is adapted to be inserted into the hole and to be in contact with the bezel body, so as to guide the first opening shield to move along the second direction.

In some embodiments, the opening shield comprises at least one second opening shield extending along a second direction, which is adapted to move, in response to an elastic force of the elastic element, along a first direction perpendicular to the second direction within a plane in parallel with the bezel body to press against the connecting piece.

In some embodiments, the at least one second opening shield comprises a pair of second opening shields, which are respectively disposed at two edges of the opening spaced apart along the first direction and are connected with each other via at least one elastic element.

In some embodiments, the bezel body further comprises a groove, wherein the at least one second opening shield is adapted to be received in the groove and to be guided by the groove to move along the first direction.

According to another aspect of the present disclosure, there is provided an electrical connection apparatus. The electrical connection apparatus comprises a connecting piece and the above bezel assembly, wherein at least a part of the connecting piece is received in the opening of the bezel assembly and remaining contact with the bezel assembly.

According to a further aspect of the present disclosure, there is provided a method for manufacturing the above bezel assembly.

Through the following illustration of the example embodiments with reference to the drawings, features of the present disclosure become more apparent. It should be appreciated that the Summary is not intended to identify key or essential features of the embodiments of the present disclosure, or limit the scope of the present disclosure. Other features of the present disclosure will be understood more easily through the following description.

BRIEF DESCRIPTION OF THE DRAWINGS

Through the following more detailed description of the example embodiments of the present disclosure with reference to the accompanying drawings, the above and other objectives, features, and advantages of the present disclosure will become more apparent, wherein the same reference sign usually refers to the same component in the example embodiments of the present disclosure.

Throughout the drawings, same or similar reference signs are used to represent same or similar elements.

DETAILED DESCRIPTION OF EMBODIMENTS

Figure 1:
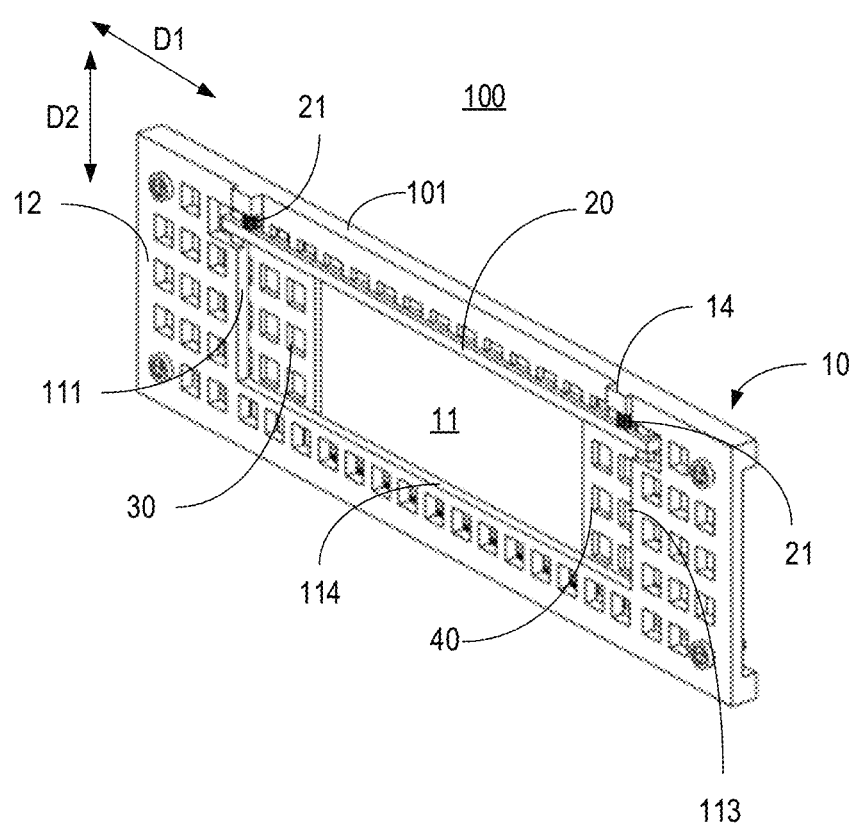
FIG. 1 illustrates a perspective view of a bezel assembly according to embodiments of the present disclosure from an angle of view.

Principles of the present disclosure are now explained with reference to various example embodiments shown in the drawings. It should be appreciated that description of those embodiments is merely to enable those skilled in the art to better understand and further implement the present disclosure and is not intended for limiting the scope disclosed herein in any manner. It should be noted that similar or same reference signs can be used in the drawings where feasible, and similar or same reference signs can represent similar or same functions. Those skilled in the art will easily recognize from the following description that alternative embodiments of the structure and the method described herein can be adopted without deviating from the principles of the present invention described herein.

As briefly described above, the inventor has noticed that in the current electrical devices including connectors or ports for data input/output and bezels thereof, an opening of a bezel must be dimensioned to be adapted to the connector or the port therein, which accordingly can ensure integrity of device appearance and keep foreign matters and dust outside from entering the device. In order to adapt to various types of connectors or ports, a variety of types of bezels are on demand, which brings a large amount of complicated work.

Based on the above knowledge, the inventor proposes a universal bezel assembly to overcome the above issues. In general, the bezel assembly comprises an opening shield whose position can be changed with different outline dimensions of connectors or ports. The opening shield can be in contact with the connector or the port all the time, so as to seal a gap between an edge of the opening and the connector or the port. Therefore, the bezel assembly according to embodiments of the present disclosure exhibits satisfactory universality. Some example embodiments of the bezel assembly are now described with reference to FIGS. 1 to 5.

In the present disclosure, "connecting piece" refers to various types of connectors or ports for implementing electrical connections or data transmissions in electrical devices. For example, "connecting piece" comprises common RJ45, SFP+, QSFP and MINISAS HD ports, among other ports, in the large-scale data storage device. It should be understood that "connecting piece" is not limited to the above listed connectors or ports and other types of connectors or ports may be expected.

Figure 2:
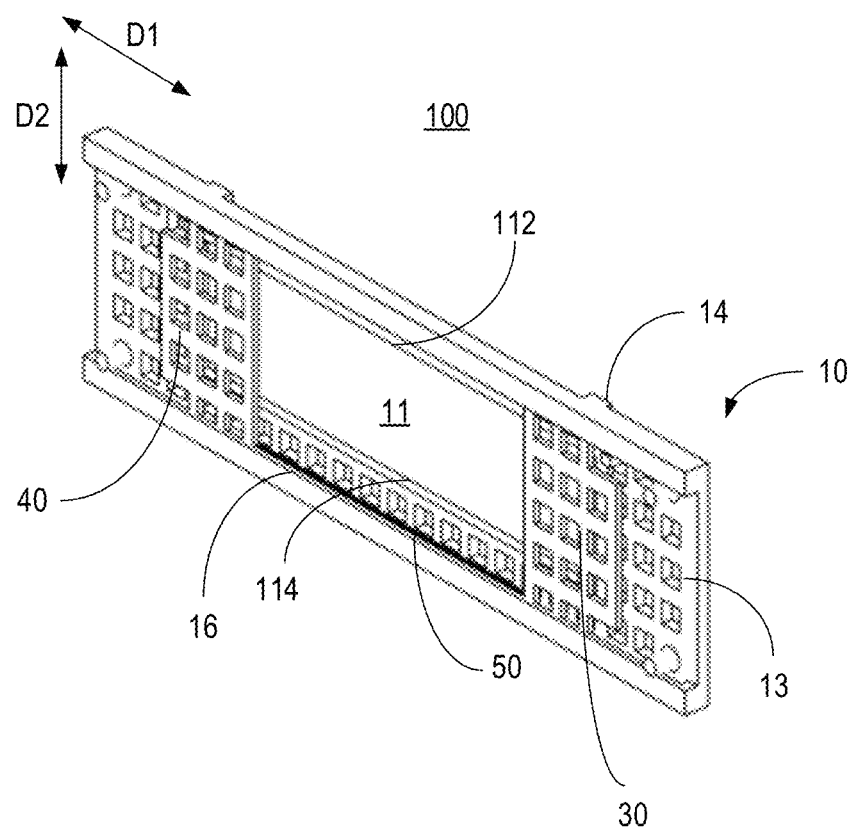
FIG. 2 illustrates a perspective view of a bezel assembly according to embodiments of the present disclosure from another angle of view.

FIGS. 1 and 2 illustrate a bezel assembly 100 in accordance with embodiments of the present disclosure from two opposite views. The bezel assembly 100 comprises a bezel body 10 and at least one opening shield 20, 30 and 40 movably disposed on the bezel body 10.

The bezel body 10 is provided with an opening 11 formed thereon. When the bezel body 10 is mounted onto an electrical device, a face represented by sign 12 is oriented towards exterior of the electrical device while a further face represented by sign 13 is oriented towards interior of the electrical device. At least a part of the above various types of connecting pieces are received in the opening 11, or extend from the opening 11 to protrude outside. Users can fulfill electrical connections or data transmissions via these parts of the connecting piece.

In the embodiments shown in connection with FIGS. 1 and 2, both the bezel body 10 and the opening 11 are rectangular. The opening 11 has four edges, which are indicated by signs 111, 113, 112 and 114, respectively. Although the bezel body 10 and the opening 11 shown in FIGS. 1 and 2 are rectangular, it should be appreciated that the bezel body 10 and the opening 11 may take various suitable shapes in accordance with the actual requirements. In addition, the shapes of the bezel body 10 and the opening 11 may be identical or different. The specific shapes of the bezel body 10 and the opening 11 shown in FIGS. 1 and 2 should not be considered as limitation to scopes of the present disclosure.

In various embodiments of the present disclosure, at least one opening shield 20, 30 and 40 is disposed. When the connecting piece is accommodated in the opening 11, the opening shields 20, 30 and 40 are pressed against the connecting piece via all kinds of elastic elements. The opening shields 20, 30 and 40 may be implemented in any suitable forms. Several example embodiments are described below. However, it should be understood that the exemplary illustration regarding the detailed form of the opening shield in the following embodiments does not restrict the composition and the structure of the present disclosure. In accordance with the teaching of the present disclosure, other forms of opening shields may be easily contemplated as long as they can seal a gap between the connecting piece and the edge of the opening.

In some embodiments, the bezel assembly 100 may comprise a first opening shield 20, for example, with reference to FIGS. 1 to 4. The first opening shield 20 is generally rod-shaped and extends along a direction (also known as "first direction" in the text) indicated by sign D1 in FIGS. 1 and 2. The first opening shield 20 is connected, via an elastic element 21 (e.g., spring), to the bezel body 10. Accordingly, in response to the elastic force of the elastic element 21, the first opening shield 20 can move along a direction (also known as "second direction" in the text) indicated by sign D2 in FIGS. 1 and 2 in parallel with the bezel body 10, and then press against the connecting piece received in the opening 11. In this way, the first opening shield 20 can keep in contact with the connecting piece, to seal a gap between the connecting piece and an edge of the opening and maintain the functionality of the connecting piece.

In order to provide stable and even elastic force for the first opening shield 20, two elastic elements 21 may be spaced apart along the first direction D1. In this way, the first opening shield 20 can move stably and reliably while keeping in contact with the connecting piece.

Figure 3:
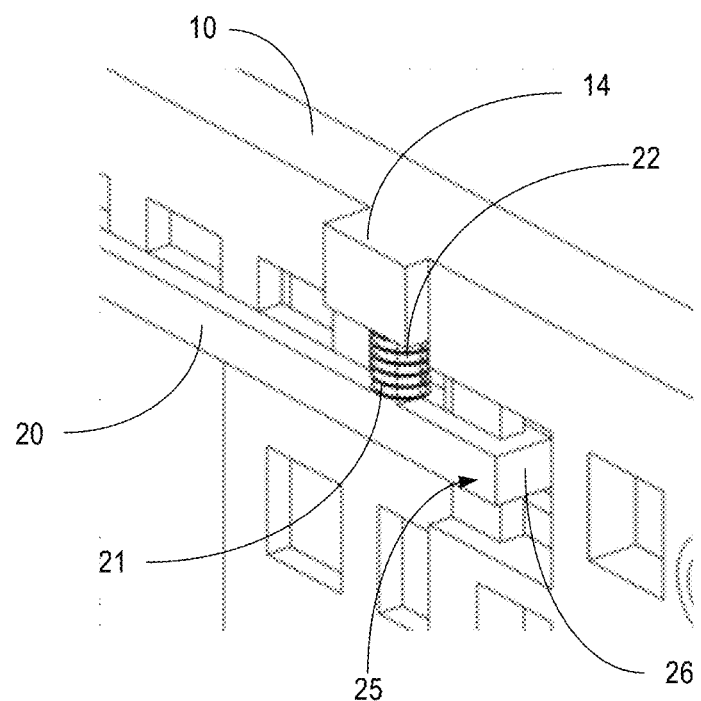
FIG. 3 illustrates a partial enlarged perspective view of a bezel assembly according to embodiments of the present disclosure.

As one of the mounting manners for the elastic element 21, for example, a protrusion 14 facing towards the outside may be disposed on the bezel body 10 as shown in FIG. 3. A column 22 is correspondingly disposed on the first opening shield 20. One end of the elastic element 21 (e.g., spring) is fixed to the protrusion 14 and another end is attached to the column 22. In this way, the elastic element 21 can be reliably and stably disposed between the first opening shield 20 and the bezel body 10.

Figure 4:
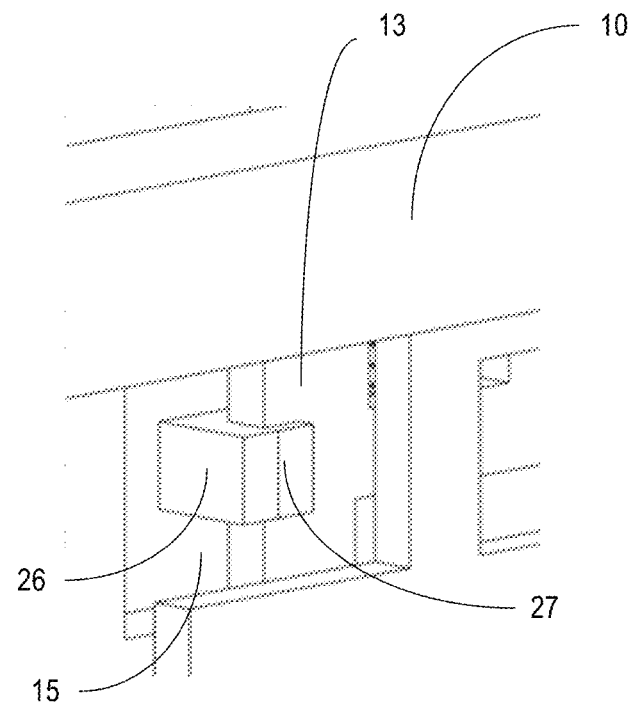
FIG. 4 illustrates a partial enlarged perspective view of a bezel assembly according to embodiments of the present disclosure from an angle of view opposite to that of FIG. 3.

In some embodiments, a structure for guiding movement of the first opening shield 20, for example, may be disposed at one end 25 of the first opening shield 20 as shown in FIGS. 3 and 4. For example, the first opening shield 20 may be provided, at its one end 25, with an extension arm 26 oriented towards the bezel body 10. The extension arm 26 may extend towards the bezel body 10 along a direction substantially perpendicular to the first opening shield 20. The bezel body 10 is provided with a hole 15 at a position corresponding to the extension arm 26, the extension arm 26 being adapted to be inserted into the hole 25 and be in contact with the bezel body 10. In this way, the extension arm 26 cooperates with the hole 15 to provide reliable guidance for the first opening shield 20, so as to facilitate the movement of the first opening shield 20 relative to the bezel body 10. It should be appreciated that the above guiding structure may be provided at both ends of the first opening shield 20, so as to guide the movement of the first opening shield 20 simultaneously at the two ends.

In addition, in some embodiments, a bending part 27 may also be disposed, for example, at an extremity of the extension arm 26 as shown in FIG. 4. The bending part 27 is adapted to be in contact with a face 13 of the bezel body 10. Accordingly, the first opening shield 20 has a hook-like structure at its extremity when being observed in the second direction D2. The hook-like structure cooperates with the bezel body 10 to facilitate stable movement of the first opening shield 20.

It should be understood that although FIGS. 1 to 4 only illustrate the first opening shield 20 near an edge 112 of the opening 11, it may be expected that the first opening shield 20 and the corresponding elastic element 21 are disposed near other three edges of the opening 11.

In some embodiments, second opening shields 30 and 40 as shown in FIGS. 1 and 2 may also be provided in addition to the above first opening shield 20. The second opening shields 30 and 40 may extend along the second direction D2 in FIGS. 1 and 2. The second opening shields 30 and 40 may also move, via the elastic element (e.g., spring), in the first direction D1 as shown in FIGS. 1 and 2 and in parallel with the bezel body 10 and finally press against two sides of the connecting piece received in the opening 11. In this way, the second opening shields 30 and 40 can remain in contact with the connecting piece at its two sides, so as to seal the gap between the connecting piece and the opening edge and maintain functionality of the connecting piece.

It should be appreciated that although FIGS. 1 and 2 illustrate second opening shields 30 and 40 being disposed in pair, only one second opening shield 30 or 40 may also be disposed in some alternative embodiments. In case there is provided with only one second opening shield 30 or 40, the second opening shield 30 or 40 may be disposed at an edge 111 or an edge 113 of the opening 11.

Referring to FIGS. 1 and 2 again, when the second opening shields 30 and 40 are disposed in pair, in order to provide elastic force for the pair of the second opening shields 30 and 40, the elastic element 50 (e.g., spring) may be provided to connect the second opening shields 30 and 40 with each other. In this way, the elastic element 50 can draw the second opening shields 30 and 40 towards each other, such that the second opening shields 30 and 40 respectively press against the two sides of the connecting piece to seal the opening 11.

Figure 5:
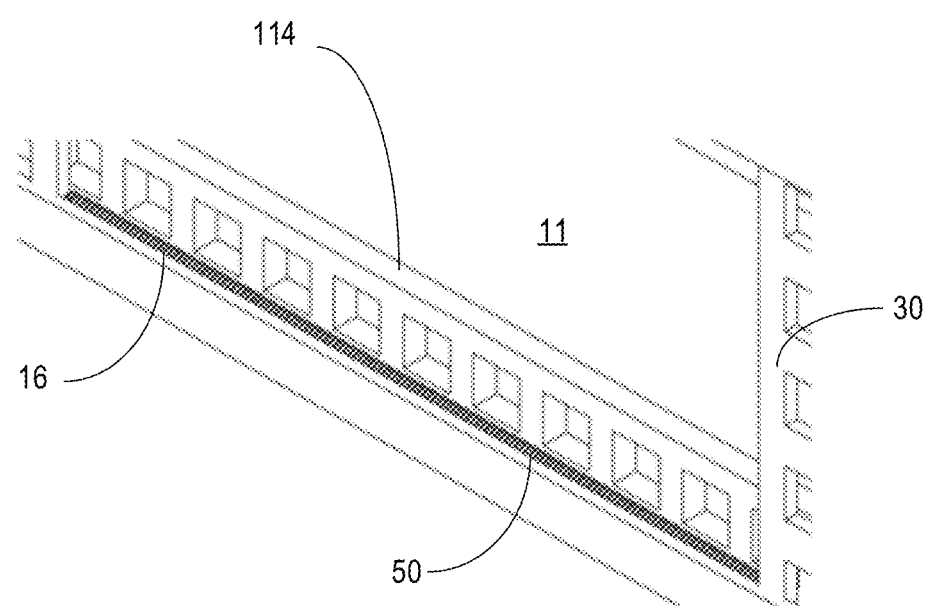
FIG. 5 illustrates a partial enlarged perspective view of a bezel assembly according to embodiments of the present disclosure from the same angle of view as FIG. 2.

Furthermore, in some embodiments, the bezel body 10 may also comprise a groove 16, which for example is disposed at the bottom of the bezel body 10 as shown in FIG. 5. The second opening shields 30 and 40 are adapted to be received in the groove 16 and to be guided by the groove 16 to move in the first direction D1. In this way, the groove 16 is used for guiding the movement of the second opening shields 30 and 40 to facilitate the movement of second opening shields 30 and 40. In addition, the elastic element 50 for connecting the second opening shields 30 and 40 may also be disposed in the groove 16 to facilitate positioning of the elastic element 50.

It should be understood that the above description of the opening shields 20, 30 and 40 is exemplary only. Quantity, position and setting mode of the above opening shields 20, 30 and 40 may be appropriately adjusted in accordance with the actual design and production environment, process, conditions and/or requirements. For example, although FIGS. 1 and 2 illustrate that the first opening shield 20 is located on the face 12 of the bezel body 10 and the second opening shields 30 and 40 are located on the face 13 of the bezel body 10, it may also be expected that the first opening shield 20 is located on the face 13 of the bezel body 10 and the second opening shields 30 and 40 are disposed on the face 12 of the bezel body 10, or the opening shields 20, 30 and 40 are located on the same face of the bezel body 10.

The embodiments of present disclosure also relate to an electrical connection apparatus 1 including the above bezel assembly 100. FIGS. 6A to 9B respectively illustrate embodiments of electrical connection apparatus 1 comprising the bezel assembly 100 and four different ports.

In various embodiments, parts of different ports are respectively received in the opening 11 of the bezel assembly 100 and remain in contact with the bezel assembly 100.

Figure 6A:
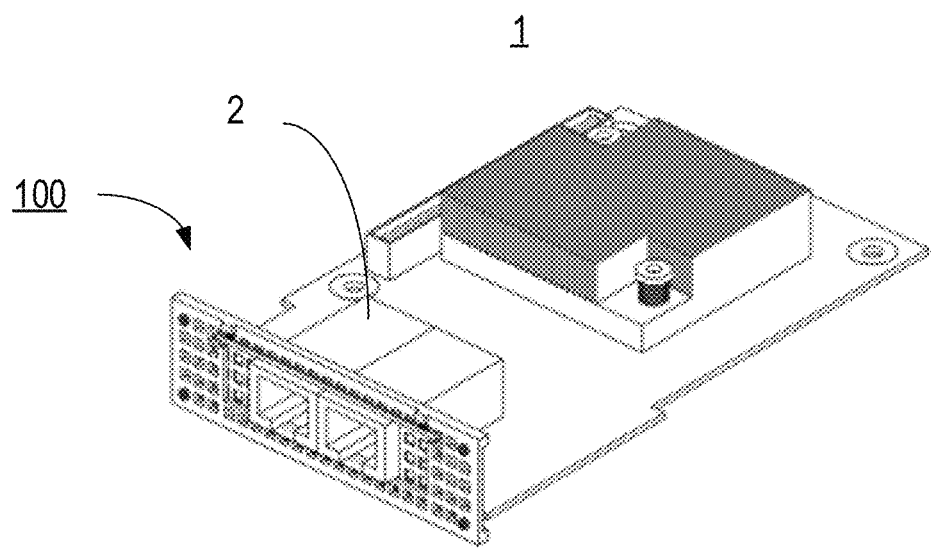
FIG. 6A illustrates a perspective view of an electrical connection apparatus comprised of a bezel assembly and one port in accordance with embodiments of the present disclosure.
Figure 6B:
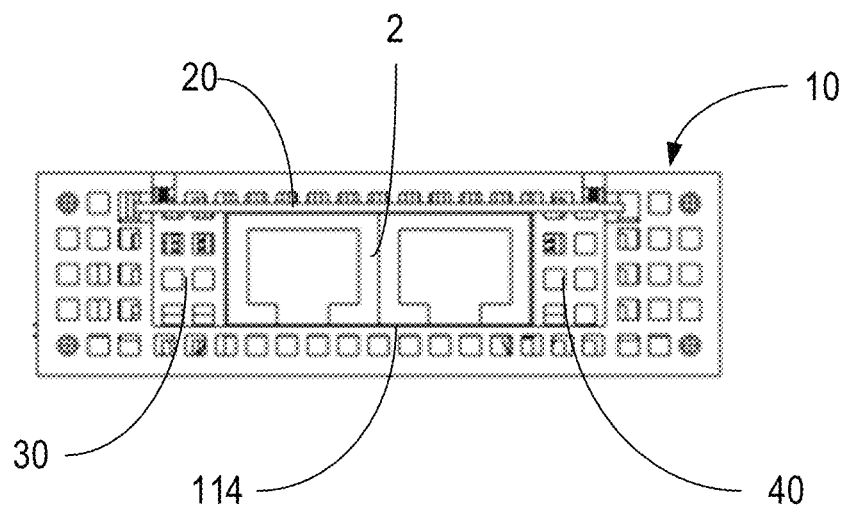
FIG. 6B illustrates a front view of FIG. 6A.

FIGS. 6A and 6B illustrate embodiments of an electrical connection apparatus 1 comprising the bezel assembly 100 and a port 2, the port 2 for example being 2xRJ45 port. Accordingly, the first opening shield 20 presses against and clamps the port 2 along the first direction D1 and the second opening shields 30 and 40 respectively press against and clamp two sides of the port 2 along the second direction D2. The port 2 is also abutted against an edge 114 of the opening 11. In this way, the port 2 is held in the opening 11 and a gap between the port 2 and the edge of the opening 11 is sealed.

Figure 7A:
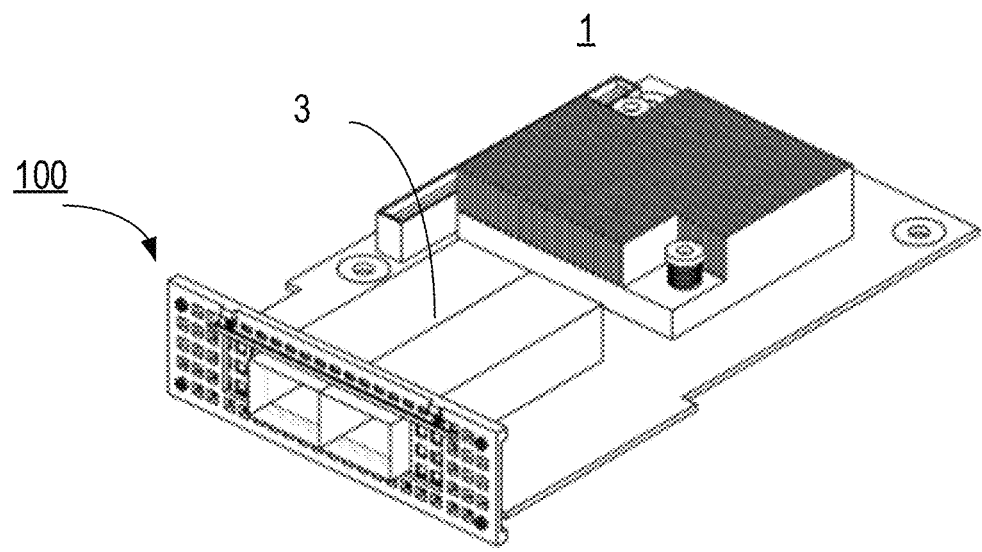
FIG. 7A illustrates a perspective view of an electrical connection apparatus comprised of a bezel assembly and another port in accordance with embodiments of the present disclosure.
Figure 7B:
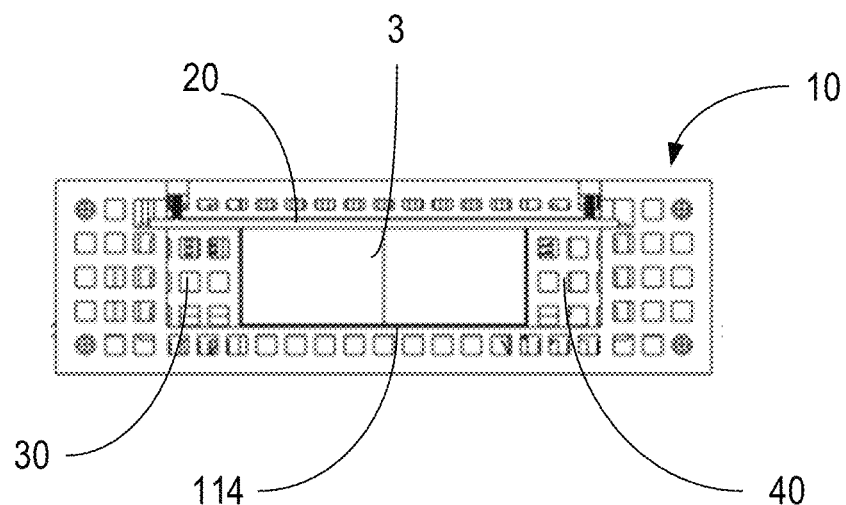
FIG. 7B illustrates a front view of FIG. 7A.

FIGS. 7A and 7B illustrate embodiments of an electrical connection apparatus 1 comprising the bezel assembly 100 and a port 3, the port 3 for example being 2xSFP+ port. Accordingly, the first opening shield 20 presses against and clamps the port 3 along the first direction D1 and the second opening shields 30 and 40 respectively press against and clamp two sides of the port 3 along the second direction D2. The port 3 is also abutted against an edge 114 of the opening 11. In this way, the port 3 is held in the opening 11 and a gap between the port 3 and the edge of the opening 11 is sealed.

Figure 8A:
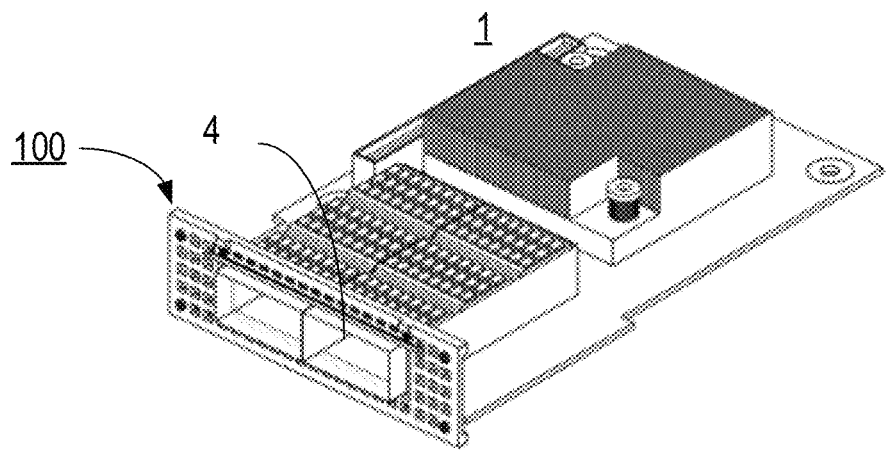
FIG. 8A illustrates a perspective view of an electrical connection apparatus comprised of a bezel assembly and yet another port in accordance with embodiments of the present disclosure.
Figure 8B:
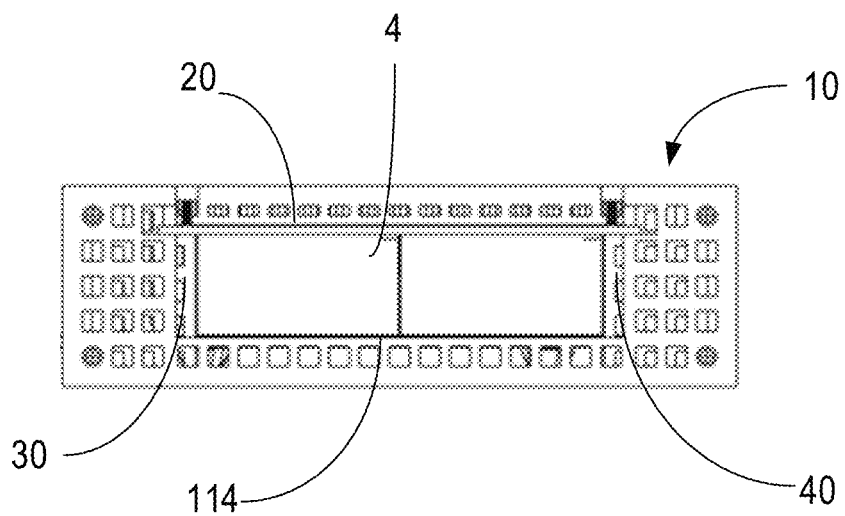
FIG. 8B illustrates a front view of FIG. 8A.

FIGS. 8A and 8B illustrate embodiments of an electrical connection apparatus 1 comprising the bezel assembly 100 and a port 4, the port 4 for example being 2xQSFP port. Accordingly, the first opening shield 20 presses against and clamps the port 4 along the first direction D1 and the second opening shields 30 and 40 respectively press against and clamp two sides of the port 4 along the second direction D2. The port 4 is also abutted against an edge 114 of the opening 11. In this way, the port 4 is held in the opening 11 and a gap between the port 4 and the edge of the opening 11 is sealed.

Figure 9A:
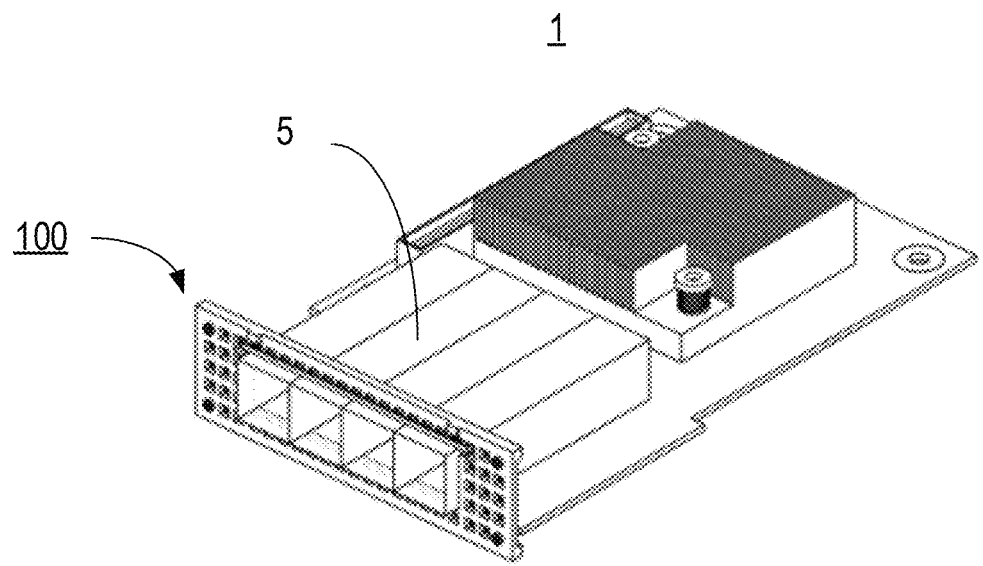
FIG. 9A illustrates a perspective view of an electrical connection apparatus comprised of a bezel assembly and yet another port in accordance with embodiments of the present disclosure.
Figure 9B:
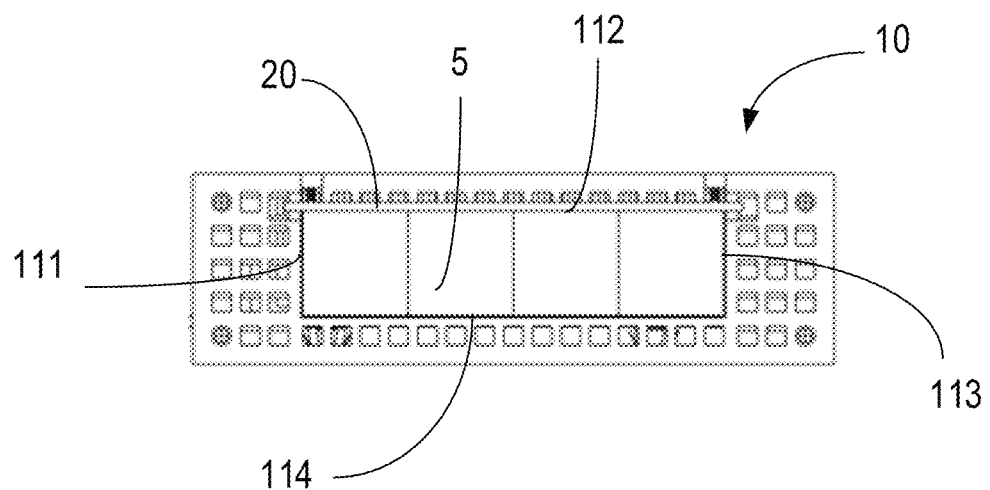
FIG. 9B illustrates a front view of FIG. 9A.

FIGS. 9A and 9B illustrate embodiments of an electrical connection apparatus 1 comprising the bezel assembly 100 and a port 5, the port 5 for example being 2xMINISAS HD port. In these embodiments, the port 5 and the opening 11 have the basically identical dimension along the first direction D1. When the port 5 is received in the opening 11, two sides of the port 5 contact the edge 111 and the edge 113 of the opening 11 respectively along the first direction D1. Meanwhile, the first opening shield 20 presses against and clamps the port 5 along the first direction D1 and the second opening shields 30 and 40 respectively press against and clamp two sides of the port 5 along the second direction D2. The port 5 is also abutted against an edge 114 of the opening 11. In this way, the port 5 is held in the opening 11.

Based on the above description, the bezel assembly 100 in accordance with embodiments of the present disclosure is provided with movable opening shields 20, 30 and 40 for satisfactory universality and can be adapted to various types and dimensions of connecting pieces. Therefore, the bezel assembly 100 and the electrical connection apparatus 1 of the present disclosure can be extensively applied into electrical devices of various types, which can facilitate fabrication, application and management and lower the costs.

It should be appreciated the above detailed embodiments of the present disclosure are provided only for illustrating or explaining the principles of the present disclosure by examples rather than restricting the present disclosure. Therefore, any amendments, equivalent substitutions and improvements, within the spirit and the principle of the present invention, should be comprised within the protection scope of the present invention. Meanwhile, the claims attached to the present disclosure are aimed to cover all changes and modifications falling within the scope and the boundary of the claims or within the equivalents of the scope and the boundary thereof.

We claim:

1. A bezel assembly, comprising:
   a bezel body defining an opening that is configured to receive at least a part of a connecting piece; and
   a pair of first opening shields that;
      are movably coupled to the bezel body;
      resiliently engage the connecting piece such that the connecting piece remains in contact with the bezel assembly in the opening;
      are respectively disposed at two edges of the opening;
      are spaced apart along a first direction; and
      are connected with each other via a first elastic element.

2. The bezel assembly of claim 1, wherein the first elastic element is located between the bezel body and the pair of first opening shields and configured to cause the pair of first opening shields to resiliently engage the connecting piece.

3. The bezel assembly of claim 1, wherein the bezel body includes a groove, and wherein the pair of first opening shields are received in the groove and configured to be guided by the groove to move along the first direction.

4. The bezel assembly of claim 1, wherein the pair of first opening shields connected to the bezel body and that extends along a second direction that is perpendicular to the first direction and parallel with an edge of the bezel body, and wherein the bezel assembly further comprises;
   a second opening shield that extends along the first direction and is configured to move along the second direction and within the plane that is parallel with the bezel body in order to engage the connecting piece.

5. The bezel assembly of claim 4, wherein the second opening shield is connected to the bezel body by at least one second elastic elements that is configured to move the second opening shield in the second direction.

6. The bezel assembly of claim 4, wherein the second opening shield is provided with an extension arm that is oriented towards the bezel body, and wherein the bezel body is provided with a hole at a position corresponding to the extension arm and the extension arm is configured to be inserted into the hole such that the extension arm is in contact with the bezel body in order to guide the second opening shield when the second opening shield is moved along the second direction.

7. An electrical connection apparatus, comprising:
   a connecting piece; and
   a bezel assembly including:
      a bezel body defining an opening;
      a pair of first opening shields that;
         are movably coupled to the bezel body,
         resiliently engage the connecting piece such that the connecting piece remains in contact with the bezel assembly in the opening;
         are respectively disposed at two edges of the opening;
         are spaced apart along a first direction; and
         are connected with each other via a first elastic element.

8. The electrical connection apparatus of claim 7, wherein the first elastic element is located between the bezel body and the pair of first opening shields and causes the pair of first opening shields to resiliently engage the connecting piece.

9. The electrical connection apparatus of claim 7, wherein the pair of first opening shields connected to the bezel body and extend along a second direction that is perpendicular to the first direction and parallel with an edge of the bezel body, and wherein the bezel assembly further comprises;
   a second opening shield that extends along the first direction is configured to move along the second direction and within the plane that is parallel with the bezel body in order to engage the connecting piece.

10. The electrical connection apparatus of claim 9, wherein the second opening shield is connected to the bezel body by at least one second elastic element that biases the second opening shield in the second direction.

11. The electrical connection apparatus of claim 9, wherein the second opening shield is provided with an extension arm that is oriented towards the bezel body, and wherein the bezel body is provided with a hole at a position corresponding to the extension arm and the extension arm is configured to be inserted into the hole such that the extension arm is in contact with the bezel body in order to guide the second opening shield when the second opening shield is moved along the second direction.

12. A method for providing a connecting piece in a bezel assembly, comprising:
   positioning, in an opening defined by a bezel body included in the bezel assembly, the connecting piece;
   moving a pair of first opening shields that are included in the bezel assembly and movably coupled to the bezel body relative to the bezel body, wherein the pair of first opening shields are;
   respectively disposed at two edges of the opening;
   spaced apart along a first direction; and
   connected with each other via a first elastic element;
      and wherein the moving the pair of first opening shields relative to the bezel assembly includes;
      moving the pair of first opening shields along the first direction and within a plane that is parallel with the bezel body; and
   resiliently engaging, in response to moving the pair of first opening shields relative to the bezel body, the connecting piece with the pair of first opening shields such that the connecting piece remains in contact with the pair of first opening shields in the opening.

13. The method of claim 12, further comprising:
causing, by the first elastic element that is located between the bezel body and the pair of first opening shields, the pair of first opening shields to resiliently engage the connecting piece.

14. The method of claim 12, wherein the pair of first opening shields are connected to the bezel body and extends along a second direction that is parallel with an edge of the bezel body, and wherein the method further comprises:
moving a second opening shield along a second direction that is perpendicular to the first direction and within a plane that is parallel with the bezel body in order to engage the connecting piece.

15. The method of claim 14, wherein the second opening shield is connected to the bezel body by at least one second elastic element that biases the second opening shield in the second direction.

16. The method of claim 14, wherein the second opening shield is provided with an extension arm that is oriented towards the bezel body, and wherein the bezel body is provided with a hole at a position corresponding to the extension arm and the extension arm is inserted into the hole such that the extension arm is in contact with the bezel body in order to guide the second opening shield when the second opening shield is moved along the second direction.

* * * * *